(12) United States Patent
Sharp et al.

(10) Patent No.: US 7,309,279 B2
(45) Date of Patent: Dec. 18, 2007

(54) COOLING AIRFLOW DISTRIBUTION DEVICE

(75) Inventors: Anthony C. Sharp, Scarborough (CA); Andrew Hudz, Etobicoke (CA); Peter Jeffery, West Hill (CA)

(73) Assignee: Sanmina-Sci Corporation, San Jose, CA (US)

( * ) Notice: Subject to any disclaimer, the term of this patent is extended or adjusted under 35 U.S.C. 154(b) by 310 days.

(21) Appl. No.: 11/179,374

(22) Filed: Jul. 12, 2005

(65) Prior Publication Data

US 2005/0250435 A1 Nov. 10, 2005

Related U.S. Application Data

(60) Continuation of application No. 10/482,832, filed on Dec. 31, 2003, now Pat. No. 7,011,576, which is a division of application No. 10/146,736, filed on May 16, 2002, now Pat. No. 6,652,373, which is a continuation of application No. 09/927,659, filed on Aug. 10, 2001, now Pat. No. 6,506,111.

(60) Provisional application No. 60/291,447, filed on May 16, 2001.

(30) Foreign Application Priority Data

May 16, 2002 (WO) .................... PCT/IB02/03067

(51) Int. Cl.
*H05K 5/00* (2006.01)
(52) U.S. Cl. .................... 454/184; 361/696; 361/695
(58) Field of Classification Search ............... 454/184, 454/195; 361/695, 696; 165/122, 80.2, 165/104.33, 104.34; 312/236
See application file for complete search history.

(56) References Cited

U.S. PATENT DOCUMENTS 3,120,166 A 2/1964 Lyman
3,387,648 A * 6/1968 Ward, Jr. et al. ............. 165/47

(Continued)

FOREIGN PATENT DOCUMENTS

DE 2537295 4/1976

(Continued)

OTHER PUBLICATIONS

International Search Report PCT/IB02/03067.

(Continued)

*Primary Examiner*—Derek S. Boles
(74) *Attorney, Agent, or Firm*—Mark G. Lappin; Foley & Lardner LLP (57) ABSTRACT

A system for removing heat from a plurality of electronic assemblies including a cabinet having brackets for supporting electronic assemblies in a vertical array between a first vertical airflow path and a second vertical air flow path of the cabinet, and a plinth underlying the cabinet and having an input port receiving air from the first vertical airflow path of the cabinet, an output port transmitting air to the second vertical air flow path, a heat exchanger positioned in an air flow path extending between the input and the output ports, and a fan assembly for driving air through the heat exchanger and towards the input port. The system further includes at least one air flow distribution device establishing a predetermined flow rate distribution through electronic assemblies supported by the brackets.

9 Claims, 9 Drawing Sheets

U.S. PATENT DOCUMENTS

| | | |
|---|---|---|
| 4,089,040 A | 5/1978 | Paulsen |
| 4,196,526 A | 4/1980 | Berti |
| 4,315,300 A | 2/1982 | Parmerlee et al. |
| 4,352,274 A | 10/1982 | Anderson et al. |
| 4,672,509 A | 6/1987 | Speraw |
| 4,851,965 A | 7/1989 | Gabuzda et al. |
| 4,860,163 A | 8/1989 | Sarath |
| 5,077,601 A | 12/1991 | Hatada et al. |
| 5,150,277 A | 9/1992 | Bainbridge et al. |
| 5,285,347 A | 2/1994 | Fox et al. |
| 5,329,425 A | 7/1994 | Leyssens et al. |
| 5,428,503 A * | 6/1995 | Matsushima et al. ....... 361/695 |
| 5,460,441 A | 10/1995 | Hastings et al. |
| 5,467,250 A * | 11/1995 | Howard et al. ............. 361/696 |
| 5,467,607 A | 11/1995 | Harvey |
| 5,509,468 A | 4/1996 | Lopez |
| 5,544,012 A * | 8/1996 | Koike ........................ 361/695 |
| 5,671,805 A | 9/1997 | Stahl et al. |
| 5,684,674 A | 11/1997 | Yin |
| 5,765,743 A | 6/1998 | Sakiura et al. |
| 5,823,005 A | 10/1998 | Alexander et al. |
| 5,826,432 A | 10/1998 | Ledbetter |
| 5,851,143 A * | 12/1998 | Hamid ........................ 454/57 |
| 5,953,930 A | 9/1999 | Chu et al. |
| 5,982,616 A | 11/1999 | Moore |
| 6,088,225 A | 7/2000 | Parry et al. |
| 6,127,663 A | 10/2000 | Jones |
| 6,164,369 A | 12/2000 | Stoller |
| 6,186,890 B1 | 2/2001 | French et al. |
| 6,198,628 B1 | 3/2001 | Smith |
| 6,294,762 B1 * | 9/2001 | Faries et al. ................. 219/400 |
| 6,336,691 B1 | 1/2002 | Maroney et al. |
| 6,643,123 B2 * | 11/2003 | Hartel et al. ................. 361/678 |
| 6,742,583 B2 * | 6/2004 | Tikka ......................... 165/291 |
| 2003/0053293 A1 * | 3/2003 | Beitelmal et al. ........... 361/687 |

FOREIGN PATENT DOCUMENTS

| | | |
|---|---|---|
| EP | 1 060 798 A1 | 6/1999 |
| JP | 63-149801 | 5/1990 |
| JP | 83-16676 | 11/1996 |
| WO | WO 01/62060 | 9/2001 |

OTHER PUBLICATIONS

International Preliminary Examination Report PCT/IB02/03067.
"Dynamic Flow Distribution Control", IBM Technical Disclosure Bulletin, IBM Corp. New York, vol. 40, No. 7, Jul. 1, 1997, pp. 49-50, ISSN 0018-8689.

* cited by examiner

COOLING AIRFLOW DISTRIBUTION DEVICE

CROSS-REFERENCE TO RELATED APPLICATION

The present application is a continuation of U.S. patent application Ser. No. 10/482,832, the disclosure of which is incorporated herein by reference in its entirety. U.S. patent application Ser. No. 10/482,832 filed Dec. 31, 2003, (now U.S. Pat. No. 7,011,576), is a divisional of U.S. patent application Ser. No. 10/146,736 filed May 16, 2002 (now U.S. Pat. No. 6,652,373), and which claims priority to International Application Patent Serial No. PCT/IB02/03067, filed May 16, 2002, which claims priority to U.S. Pat. No. 6,506,111, filed Aug. 10, 2001, and provisional U.S. patent application Ser. No. 60/291,447, filed May 16, 2001. U.S. patent application Ser. No. 10/146,736 is a continuation in part of U.S. patent application Ser. No. 09/927,659 (now U.S. Pat. No. 6,506,111).

FIELD OF THE INVENTION

This invention relates to a method and system for removing heat from electronic data servers or similar equipment and, more particularly, to a system having a closed cabinet for supporting electronic assemblies, a plinth for providing a cooling airflow to the interior of the cabinet, and distribution devices for distributing the cooling airflow within the cabinet.

BACKGROUND OF THE INVENTION

The advent of high-density electronic data servers has led to the mounting of as many as forty-two (42) servers in one cabinet, typically seven (7) feet high. This in turn has greatly increased the total heat load in such cabinets, reaching as high as ten (10) kilowatts, with attendant problems of maintaining acceptable working temperatures inside the cabinet. Without acceptable working temperatures, the life and reliability of the servers are reduced. Since these servers commonly handle large amounts of sensitive and valuable data, uncontrolled working temperatures are not acceptable, and steps to maintain the servers at a relatively cool and steady temperature are required.

One method of cooling server cabinets is to install the cabinets in rooms that are air conditioned and/or supplied with ducted, cooled air. There are, however, several disadvantages to this method. To begin with, energy is wasted since the whole room and the contents of the room must be cooled. In addition, because the cabinets are mounted in rows, the heated air which exits one row of cabinets adversely affects the temperature of adjacent rows of cabinets. Furthermore, upgrading existing installations by the addition of cabinets filled with high density servers may not be possible since the cooling capacity of existing room air-conditioning units may be exceeded. Also, with the shortages of available electrical power, the demand of new room air-conditioner systems may not be met by the public utility. Finally, floor-standing heat management units are sometimes provided in such rooms for cooling the air delivered to the cabinets. Such units, however, occupy valuable floor area that could be more profitably occupied by a server cabinet.

What is still desired, therefore, is a new and improved system for removing heat from a plurality of electronic assemblies, such as data servers. Such a system will preferably use available power more efficiently to cool the electronic devices. In particular, such a system will preferably cool only the interior portions of the cabinet, as opposed to entire rooms. In addition, such a system will preferably cool the interior portions of the cabinet independently of adjacent server cabinets or rows of server cabinets. Furthermore, such a system will preferably utilize floor area more efficiently, and more easily accommodate the upgrading of existing installations by the addition of server cabinets.

SUMMARY OF THE INVENTION

The present invention provides a new and improved system for removing heat from a plurality of electronic assemblies, such as data servers. The system includes at least one cabinet having brackets for supporting electronic assemblies in a vertical array between a first vertical airflow path and a second vertical air flow path of the cabinet.

The system also includes at least one plinth underlying the cabinet and having an input port receiving air from the first vertical airflow path of the cabinet, an output port transmitting air from the plinth to the second vertical air flow path of the cabinet, and a plinth air flow path extending between the input and the output ports. At least one heat exchanger is positioned in the plinth air flow path for transferring heat to a heat exchange medium passing through the heat exchanger, and at least one fan assembly is disposed along the plinth air flow path for driving air through the heat exchanger.

The system further includes at least one air flow distribution device establishing a predetermined flow rate distribution through electronic assemblies supported by the brackets. The air flow distribution device ensures that vertically arrayed electronic devices supported in the cabinet receive a predetermined portion of cooling airflow (e.g., equal) from the plinth.

According to one aspect of the invention, the distribution device is adapted such that the predetermined flow rate distribution is substantially the same (such that each vertically arrayed electronic device receives an equal portion of cooling airflow).

According to another aspect, the distribution device is positioned between the second air flow path of the cabinet and the brackets. According to an additional aspect, the distribution device is substantially planar and extends vertically, and includes a plurality of apertures in a predetermined pattern of sizes and positions. According to a further aspect, the apertures of the distribution device are equally sized and provided in horizontal rows corresponding to the brackets, and the horizontal rows closest to the plinth include fewer apertures than the horizontal rows furthest from the plinth.

The present invention provides another air flow distribution device for establishing a predetermined flow rate distribution through electronic devices supported within the cabinet. This device is positioned in one of the airflow paths of the cabinet and extends vertically and laterally between a lower end nearer the plinth and an upper end further from the plinth, such that the upper end of the distribution device is closer to the brackets than the lower end.

The foregoing and other features, aspects and advantages of the present invention will become more apparent from the following detailed description of the present invention when taken in conjunction with the accompanying drawings.

BRIEF DESCRIPTION OF THE DRAWINGS

Like reference characters designate identical or corresponding components and units throughout the several views.

DETAILED DESCRIPTION OF THE INVENTION

Referring to FIGS. 1 through 4, the present disclosure provides a new and improved system 10 for removing heat from a plurality of electronic assemblies, such as data servers. The system 10 includes at least one cabinet 12 containing means 14 for supporting electronic assemblies such as data servers, at least one plinth 16 containing means 18 for creating an airflow through the cabinet 12 and means 20 for removing heat from the airflow, and at least one air flow distribution device 22 for establishing a predetermined flow rate distribution through the cabinet 12.

Typical applications for the presently disclosed system 10 are found in "data centers" that contain hundreds of cabinets containing "servers" or other electronic data equipment. The equipment may, for example, be used for telecommunication purposes or for high speed internet or streaming data services. In the embodiment shown, the means for supporting the electronic assemblies comprise brackets 14 arranged to support the assemblies in a vertical array and wherein housings of the electronic assemblies will create separate horizontal passages in the vertical array. For purposes of illustration, the server housings are represented by horizontal lines 15 extending between the brackets 14. The "brackets" 14 generally comprise vertical metal strips that have spaced-apart mounting holes for the servers, etc. The servers normally are equipped with mounting brackets at or near their front faces which are fastened to the "brackets" 14 with screws. The means 14 for supporting the electronic assemblies in a vertical array can alternatively comprise shelves or other suitable hardware.

Figure 1:
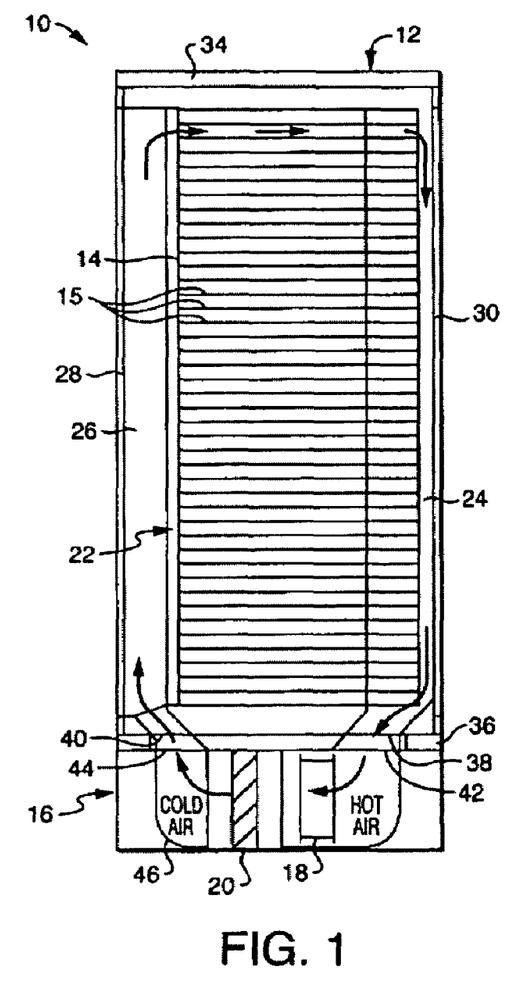
FIG. 1 is a side sectional view of a new and improved system for removing heat from a plurality of electronic assemblies, such as data servers, constructed in accordance with the present invention and including a cabinet mounted on top of a cooler plinth.
Figure 2:
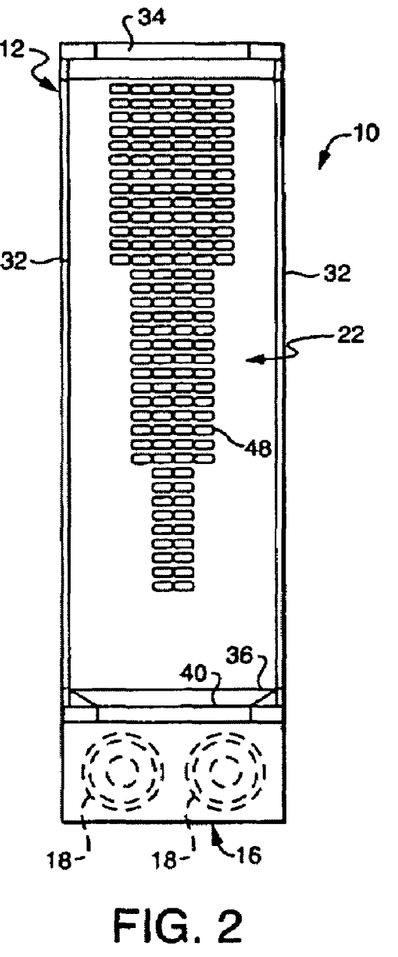
FIG. 2 is a front elevation view of the system of FIG. 1 with a front panel of the cabinet removed to reveal an air flow distribution device of the cabinet.
Figure 3:
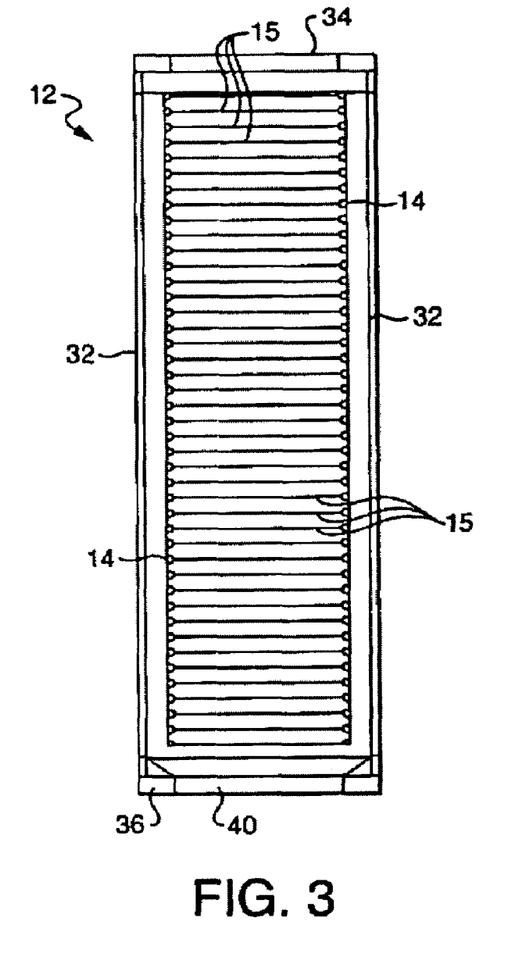
FIG. 3 is a front elevation view of the cabinet of the system of FIG. 1 removed from the plinth, with a front panel and the air flow distribution device of the cabinet also removed to reveal a vertical array of server brackets of the cabinet.

Referring first to FIGS. 1 through 3, the cabinet 12 of the present disclosure includes the brackets 14 for supporting electronic assemblies in the vertical array 15 between a first vertical airflow path 24 and a second vertical air flow path 26 of the cabinet. The cabinet 12 is enclosed about the brackets 14 and the vertical airflow paths 24, 26 and includes front and rear panels 28, 30, side panels 32, and a top panel 34. The front and rear panels 28, 30 can be attached to the cabinet 12 with hinges to act as doors and provide access to electronic components supported on the brackets 14. A base 36 of the cabinet 12 defines an outlet 38 for the first vertical airflow path 24 and an inlet 40 for the second vertical airflow path 26. Other than the inlet 40 and the outlet 38 defined by the base 36, the cabinet 12 is closed such that the airflow through the cabinet is re-circulated.

Figure 4:
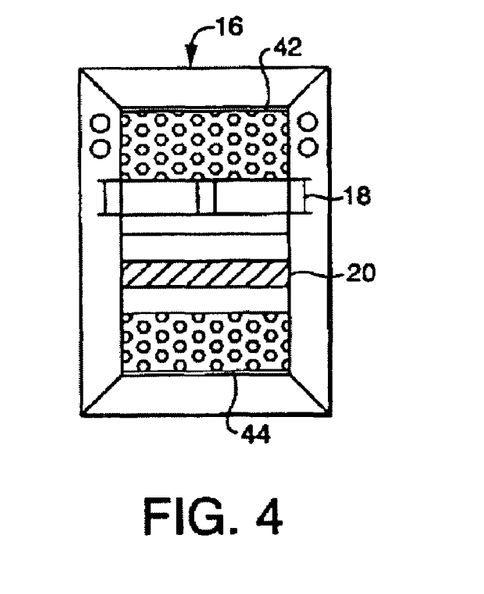
FIG. 4 is a top plan view of the cooler plinth of the system of FIG. 1.

Referring to FIGS. 1, 2 and 4, the plinth 16 underlying the cabinet 12 has an input port 42 receiving air from the outlet 38 of the first vertical airflow path 24 of the cabinet, an output port 44 transmitting air from the plinth to the inlet 40 of the second vertical air flow path 26 of the cabinet, and a plinth air flow path 46 extending between the input and the output ports. At least one heat exchanger 20 is positioned in the plinth air flow path 46 for transferring heat to a heat exchange medium passing through the heat exchanger 20, and at least one fan assembly 18 is disposed along the plinth air flow path 46 for driving air through the heat exchanger 20 and the cabinet 12. The heat exchanger 20 preferably comprises coils that receive liquid coolant for circulation from a remote source, which may include a refrigerant evaporator. Heat from the airflow received from the cabinet 12 is absorbed by coolant in the coils 20. Preferably, the coolant comprises cool water.

Alternatively, and in accordance with one exemplary embodiment, the coolant comprises a refrigerant fluid, such as ammonia, a chlorofluorocarbon, or a newer, ozone safe refrigerant. The heat exchanger 20 itself then functions as the evaporator and include an expansion valve, such that the refrigerant is in a gaseous state as it passes through the plinth 16. Preferably, the compressor and the evaporator coils are provided remotely from the plinth 16 and the cabinet 12. The important advantage of this arrangement is that the presence of water in the plinth 16 and the cabinet 12 is avoided. This is highly desirable in telecommunications facilities where continuity of service is paramount, and where water presents a risk to the electronics equipment, should there be a pipe rupture. In the case of refrigerant there is no serious risk due to a pipe rupture since the refrigerant is electrically non-conducting, and anyway would return to its gaseous state on escape from the pipe.

To achieve the high reliability desired for the system 10, redundancy of essential operating components is preferably employed. Thus, multiple fans 18 are used, so that failure of one fan does not cause total failure of the system 10. Similarly, the heat exchanger 20 preferably comprises multiple chilling coils. Furthermore, the fans 18 and the heat exchanger 20 are constructed and mounted in such a way as to facilitate rapid withdrawal and replacement, for instance on sliding drawers. Remote signaling of alarm conditions, such as fan failure, or high temperature conditions, will facilitate prompt attention by maintenance staff, thus improving overall reliability. To further enhance the rapid servicing of the essential operating components, quick-disconnect means may be employed, for instance the water connections may be made by means of the well-known "double-shutoff" hydraulic hose couplers, and the electrical connections by shrouded plugs and sockets.

In one embodiment of the present disclosure, the plinth 16 can be sized to support multiple cabinets 12. In another embodiment, the plinth 16 may contain one chilling coil 20 for each cabinet 12 mounted on the plinth, one for two or more cabinets, or one for all cabinets mounted upon the plinth. In an alternative embodiment, the plinth 16 may contain one fan 18, or several fans for the movement of air. In a further embodiment, multiple plinths 16 may be used to support and cool a single cabinet 12. In yet another embodiment, side-by-side cabinets 12 and plinths 16 may be bolted together to provide greater resistance to seismic activity. Many combinations and arrangements are possible without departing from the scope of the present invention.

In any event, the modular arrangement of the plinth 16 and the cabinet 12 makes the system 10 versatile and provides improved energy efficiency in comparison to cooling an entire room full of cabinets. The present system 10, thus, reduces running costs and enables larger installations with a given power availability. In addition, by placing the heat removal means in close conjunction with the servers, a better control of the heat removal may be achieved, and, since the temperature may be better regulated, the life and reliability of the servers may be enhanced.

Because the plinth 16 has substantially the same "footprint" dimensions as the cabinet 12, valuable floor area within a server room or installation is made available. Also, by keeping the water-containing parts of the system 10 in the plinth 16, beneath the cabinet 12, the effects of any coolant leak are greatly minimized. Finally, since the specific heat of water and the density of water (or other suitable liquid coolant) are much higher than air, water is a much better medium for moving heat from the cabinet 12, as compared to just air.

Referring to FIGS. 1 and 2, the air flow distribution device 22 of the system 10 is for establishing a predetermined flow rate distribution through various electronic assemblies supported by the brackets 14. In the embodiment shown, the device 22 is configured such that the predetermined flow rate distribution is substantially the same. In other words, the device 22 apportions cooling airflow from the second airflow path 26 of the cabinet 12 approximately equally amongst electronic assemblies supported by the brackets 14, so that each data server held therein is cooled by the same amount of air. However, it should be understood that the device 22 can be configured such that the predetermined flow rate distribution varies, to accommodate different types or sizes of data servers (which might provide different heat loads) for example.

As shown, the distribution device 22 is positioned between the second air flow path 26 of the cabinet 12 and the brackets 14. However, the distribution device 22 can alternatively be positioned between the brackets 14 and the first airflow path 24 of the cabinet. In addition, the cabinet 12 can be provided with two of the distribution devices 22, one positioned between the second air flow path 26 of the cabinet and the brackets 14 and the other positioned between the brackets and the first airflow path 24 of the cabinet.

The distribution device 22 is substantially planar and extends vertically, and includes a plurality of apertures 48 in a predetermined pattern of sizes and positions. As shown in FIG. 2, the apertures 48 of the distribution device 22 at different distances from the plinth 16 are sized and positioned to apportion airflow from the second airflow path 26 of the cabinet approximately equally amongst the brackets 14. In particular, the apertures 48 are equally sized and provided in horizontal rows corresponding to the brackets 14, and the horizontal rows closest to the plinth 16 include fewer apertures 48 than the horizontal rows furthest from the plinth (if appropriate to the desired flow rate distribution, however, the horizontal rows closest to the plinth 16 can be provided with more apertures 48 than the horizontal rows furthest from the plinth).

The distribution device 22 can alternatively be provided with a plurality of apertures, wherein the apertures are provided in horizontal rows, each row includes the same number of apertures, but the sizes of the apertures increase further from the plinth 16 (if appropriate to the desired flow rate distribution, however, the sizes of the apertures can be provided as decreasing further from the plinth 16). The distribution device 22 can alternatively be provided with aperture in horizontal rows, wherein the numbers of apertures in each row and the sizes of the apertures both increase further from the plinth 16 (if appropriate to the desired flow rate distribution, however, the numbers of apertures in each row and the sizes of the apertures can both be provided as decreasing further from the plinth 16).

Thus, the predetermined pattern of sizes and positions of the apertures can be varied to provide a desired flow rate distribution without departing from the scope of the present invention. Although not shown, the apertures 48 can also be provided with louvers to help direct airflow from the vertical airflow path 29 in a horizontal direction through electronic devices supported by the brackets 14.

Referring now to FIGS. 5 through 9, another air flow distribution device 50 constructed in accordance with the present invention is shown. This distribution device 50 is for use with the system 10 of FIG. 1 in place of the distribution device 22 of FIG. 1. When assembled to the cabinet 12, the distribution device 50 of FIG. 5 extends vertically and laterally within the second airflow path 26 between a lower end 52 nearer the plinth 16 and an upper end 54 further from the plinth 16, such that the upper end 54 of the distribution device is closer to the brackets 14 than the lower end 52. In the embodiment shown, the device 50 is substantially planar. In this manner, the device 50 reduces the cross-sectional area of the second air flow path 26 further from the plinth 16, to apportion airflow from the second airflow path 26 of the cabinet 12 approximately equally amongst electronic devices supported by the brackets 14.

Figure 5:
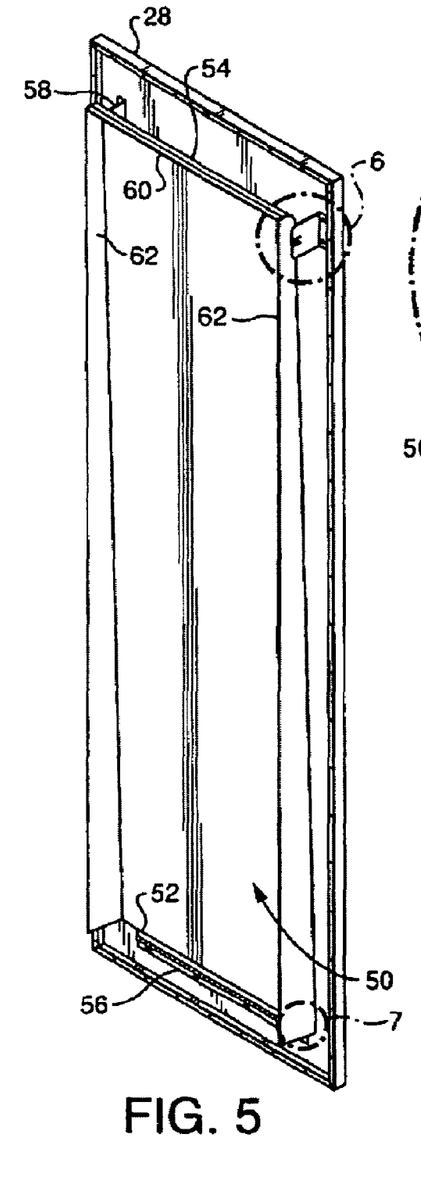
FIG. 5 is a rear perspective view of another front panel for use with the cabinet as shown in FIG. 3, wherein another air flow distribution device constructed in accordance with the present disclosure is attached to the front panel.
Figure 6:
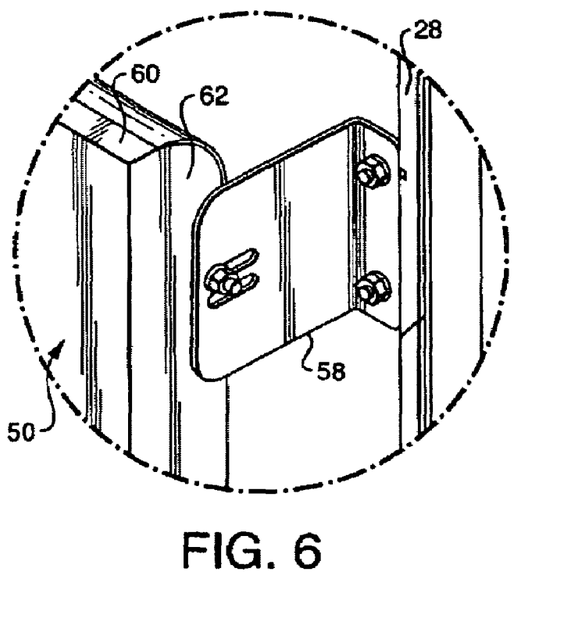
FIG. 6 is an enlarged view of the portion of the front panel and the air flow distribution device contained in circle 6 of FIG. 5.
Figure 7:
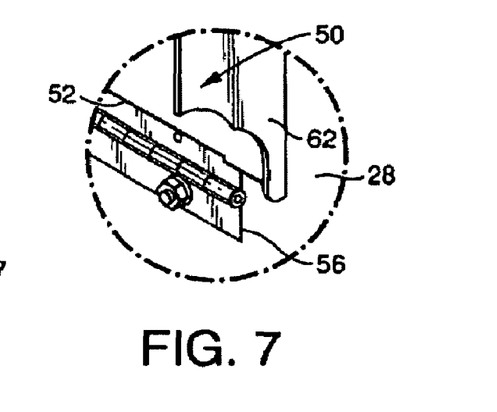
FIG. 7 is an enlarged view of the portion of the front panel and the air flow distribution device contained in circle 7 of FIG. 5, with a portion of the air flow distribution cut-away.
Figure 8:
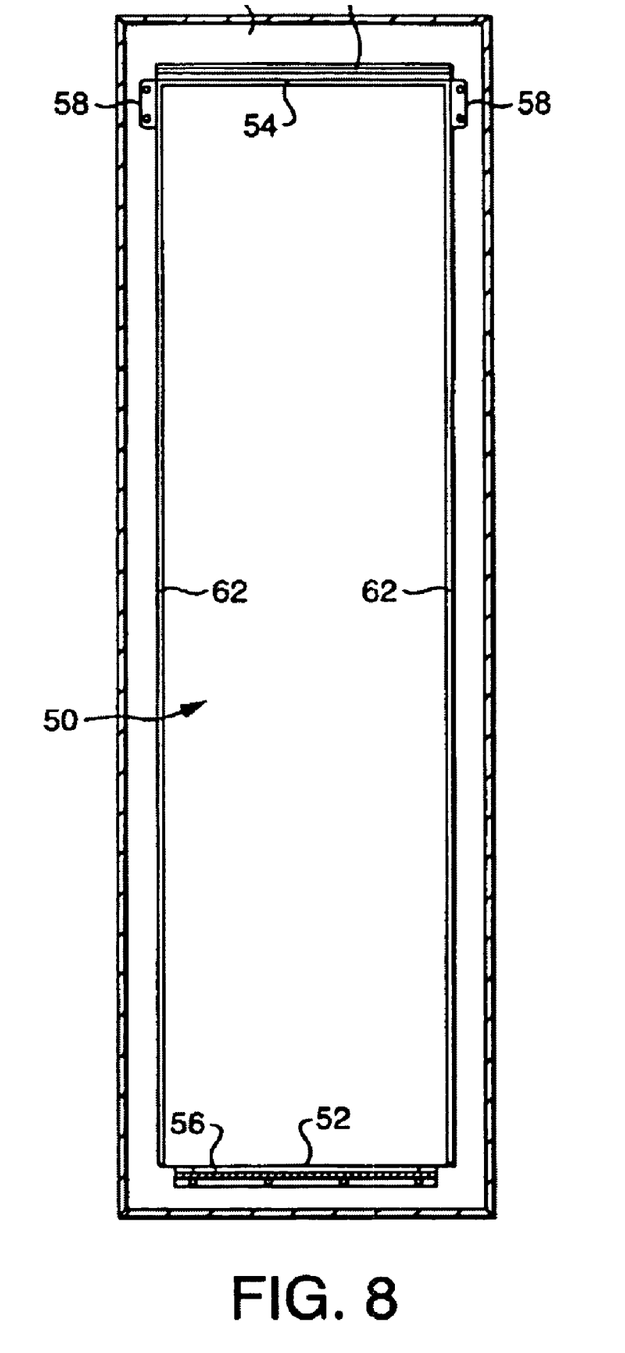
FIG. 8 is a rear elevation view of the front panel and the air flow distribution device of FIG. 5.
Figure 9:
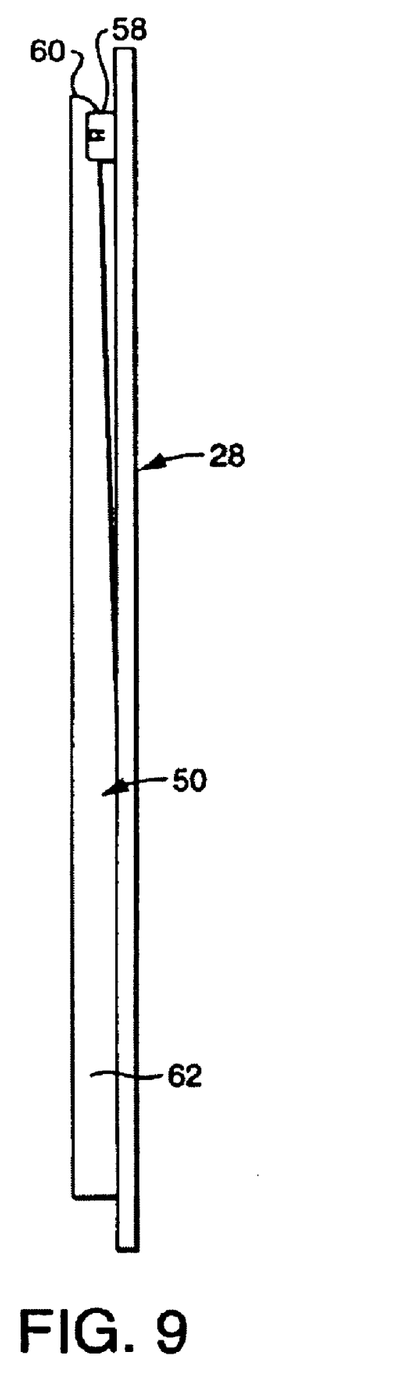
FIG. 9 is a side elevation view of the front panel and the air flow distribution device of FIG. 5.

It should be understood, that the device 50 can be configured to be curved, or otherwise formed, instead of planar, so as provide a varied airflow distribution. In addition, the device 50 can be positioned in the first airflow path 24 of the cabinet 12 instead of the second airflow path 26. Furthermore, the cabinet 12 can be provided with two of the distribution devices 50, one positioned in the second air flow path 26 and the other positioned in the first airflow path 24 of the cabinet.

In the embodiment of FIGS. 5 through 9, the distribution device 50 is mounted to the inside of the front panel 28 of the cabinet 28. As shown, the lower end 52 is secured to the panel 28 with a hinged assembly 56, while the upper end 54 is adjustably secured to the panel with brackets 58, such that the position of the upper end with respect to the brackets 14 can be adjusted. Preferably, the device 50 is provided with a hood 60 at the upper end extending towards the brackets 14 and side plates 62 extending downwardly from the hood for helping to direct airflow towards the brackets. As shown best in FIG. 9, the side plates 62 are configured such that an edges 64 of the side plates 62 extend vertically and parallel with the panel 28. Although not shown, the distribution device 50, the hood 60, and the side plates 62 are preferably sized and positioned within the cabinet such that a substantially enclosed duct is formed between the distribution device 50 and the vertical array of servers.

Figure 10:
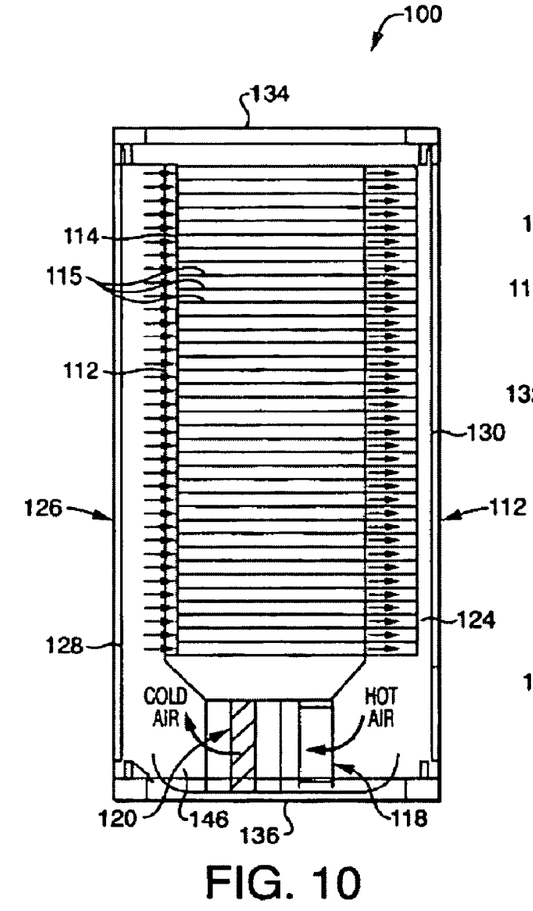
FIG. 10 is a side sectional view of another new and improved system for removing heat from a plurality of electronic assemblies, such as data servers, constructed in accordance with the present invention.
Figure 11:
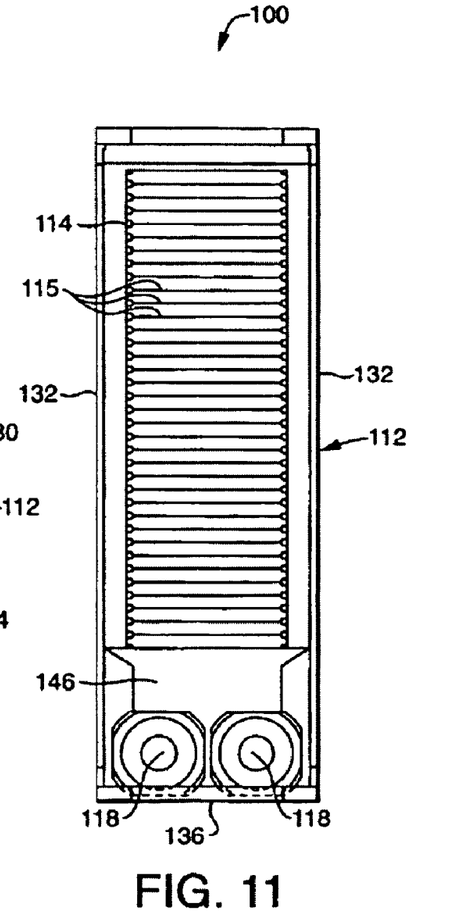
FIG. 11 is a rear sectional view of the system of FIG. 10.

FIGS. 10 and 11 show another new and improved system 100 for removing heat from a plurality of electronic assemblies, such as data servers, constructed in accordance with the present invention. The system 100 of FIGS. 10 and 11 is similar to the system 10 of FIGS. 1 through 4 such that the same elements have the same reference numeral preceded by a "1". The system 100 of FIGS. 10 and 11, however, does not include a plinth, but instead includes a cabinet 112 that houses the axial fans 118 and the heat exchanger 120.

The cabinet 112 includes the brackets 14 for supporting electronic assemblies in a vertical array 115 between the first vertical airflow path 124 and the second vertical air flow path 126 of the cabinet, and the air flow distribution device 122 positioned between the second vertical air flow path 126 and the vertical array 115 for establishing a predetermined flow rate distribution through the vertical array 115. The cabinet 112 is enclosed about the brackets 114 and the vertical airflow paths 124, 126 and includes a closed base 136. The fans 118 and the heat exchanger 120 are positioned between the base and the vertical array 115, and the cabinet 112 defines an air flow path 146 connecting the first vertical airflow path 124 and the second vertical air flow path 126 of the cabinet 112 and directing air flow through the fans 118 and the heat exchanger 120.

By housing the fans 118 and the heat exchanger 120 instead of being placed on a separate plinth, the cabinet 112 of FIGS. 10 and 11 reduces the overall height of the system 100. The shorter overall height simplifies on-site access to the electronics contained in the cabinet, since the electronics are closer to the floor.

Figures 12, 13:
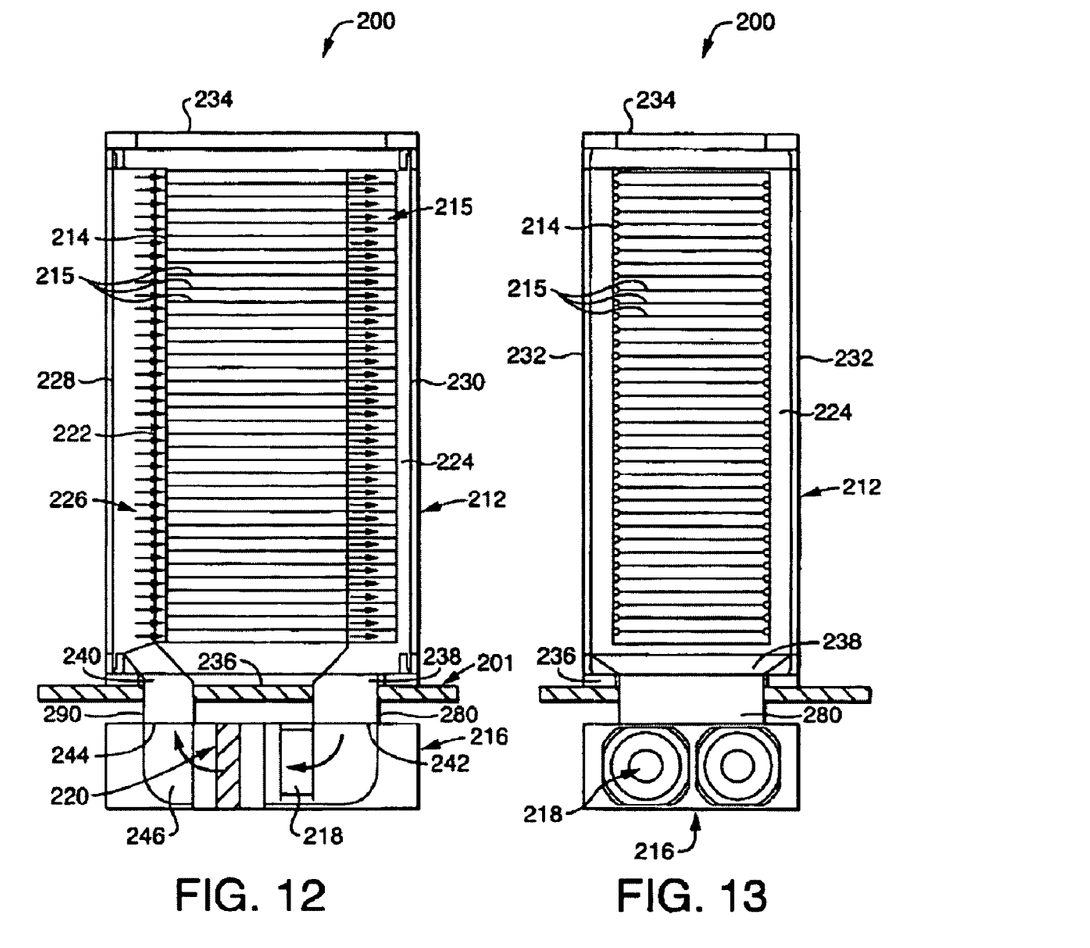
FIG. 12 is a side sectional view of an additional new and improved system for removing heat from a plurality of electronic assemblies, such as data servers, constructed in accordance with the present invention.
FIG. 13 is a rear sectional view of the system of FIG. 12.

FIGS. 12 and 13 show an additional new and improved system 200 for removing heat from a plurality of electronic assemblies, such as data servers, constructed in accordance with the present invention. The system 200 of FIGS. 12 and 13 is similar to the system 10 of FIGS. 1 through 4 such that the same elements have the same reference numeral preceded by a "2". The system 200 of FIGS. 12 and 13, however, includes a plinth 216 positioned below a floor 201 supporting the cabinet 212, and ducts 280, 290 extending through the floor 201 and connecting the plinth 216 to the cabinet 212. This arrangement reduces the height of the system 200 above the floor 201, further removes the presence of coolant from the electronics contained in the cabinet 212, and simplifies on-site access to the electronics contained in the cabinet 212, since the electronics are closer to the floor 201.

Figure 14:
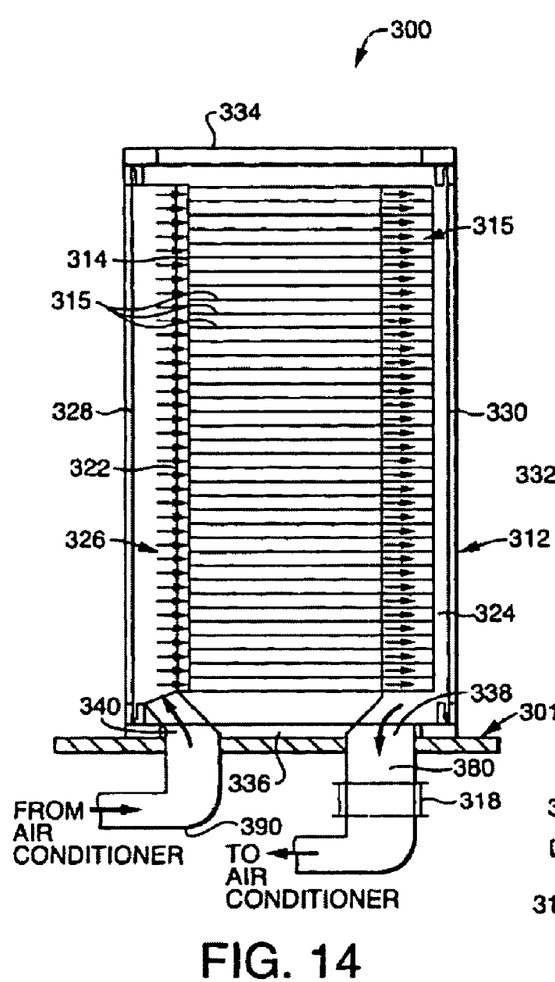
FIG. 14 is a side sectional view of a further new and improved system for removing heat from a plurality of electronic assemblies, such as data servers, constructed in accordance with the present invention.
Figure 15:
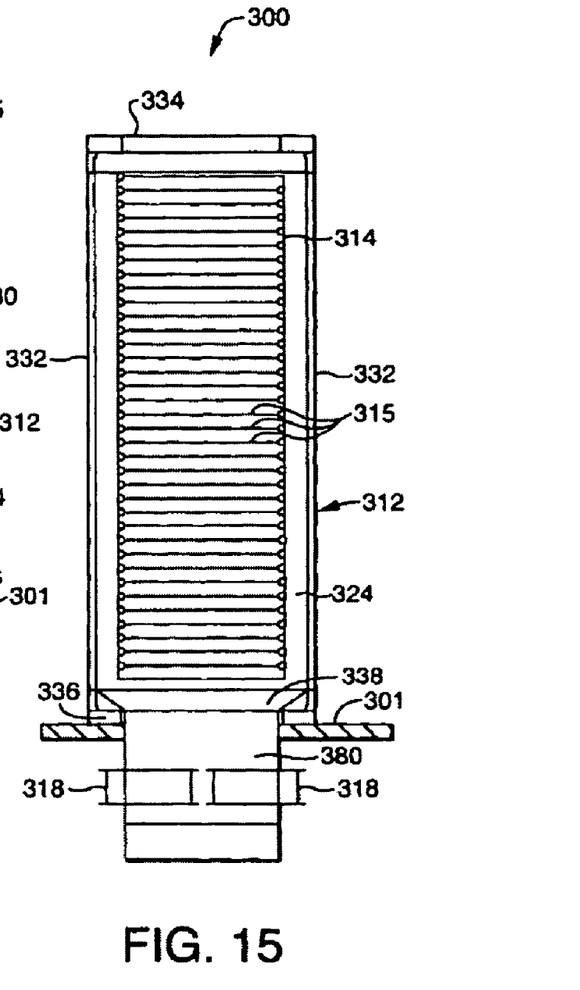
FIG. 15 is a rear sectional view of the system of FIG. 14.

FIGS. 14 and 15 show another new and improved system 300 for removing heat from a plurality of electronic assemblies, such as data servers, constructed in accordance with the present invention. The system 300 of FIGS. 14 and 15 is similar to the system 10 of FIGS. 1 through 4 such that the same elements have the same reference numeral preceded by a "3". The system 300 of FIGS. 14 and 15, however, does not include a plinth, but instead includes ducts 380, 390 extending through a floor 301 supporting the cabinet 312 and connecting the cabinet 312 to a remote heat exchanger (not shown). Axial fans 318 are positioned in at least one of the ducts 380, 390 for helping to circulate air flow between the cabinet 312 and the remote heat exchanger. The ducts 380, 390 are preferably insulated. This arrangement reduces the height of the system 300 above the floor 301, further removes the presence of coolant from the electronics contained in the cabinet 312, and simplifies on-site access to the electronics contained in the cabinet 312, since the electronics are closer to the floor 301.

Figure 16:
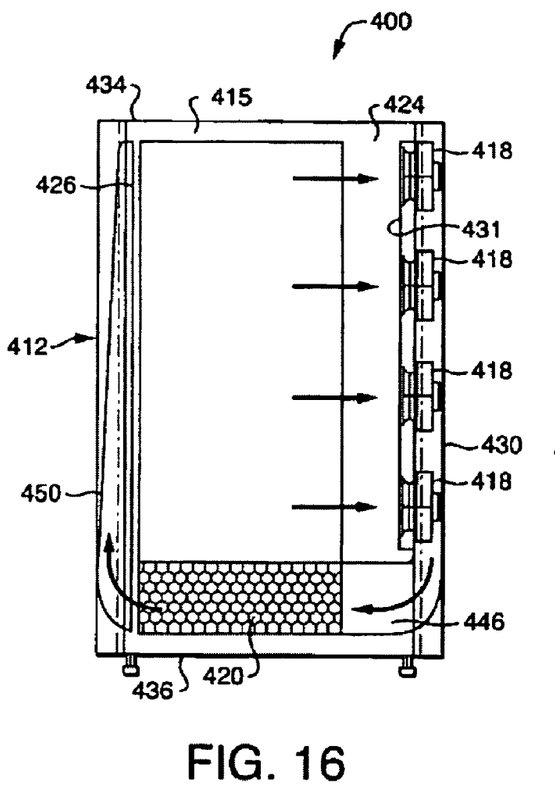
FIG. 16 is a side sectional view of still another new and improved system for removing heat from a plurality of electronic assemblies, such as data servers, constructed in accordance with the present invention.
Figure 17:
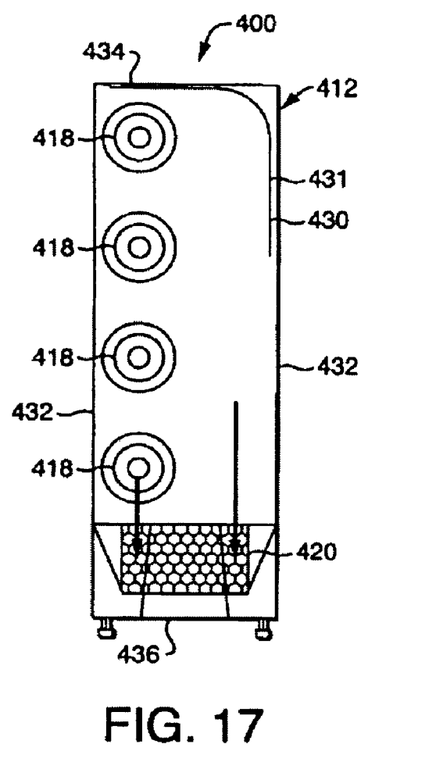
FIG. 17 is a rear sectional view of the system of FIG. 16.
Figure 18:
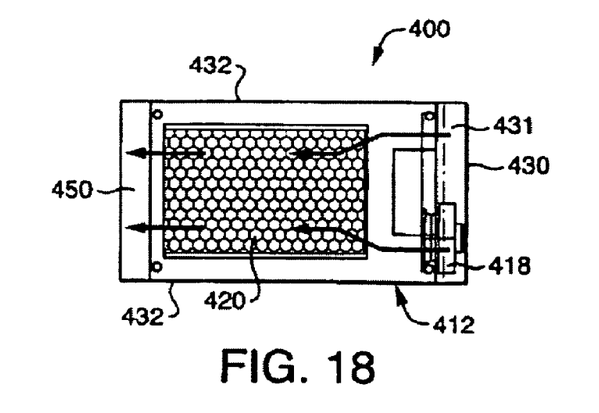
FIG. 18 is a bottom sectional view of the system of FIG. 16.

FIGS. 16 through 18 show another new and improved system 400 for removing heat from a plurality of electronic assemblies, such as data servers, constructed in accordance with the present invention. The system 400 of FIGS. 16 through 18 is similar to the system 10 of FIGS. 1 through 4 such that the same elements have the same reference numeral preceded by a "4". The system 400 of FIGS. 16 through 18, however, does not include a plinth, but instead includes a cabinet 412 that houses centrifugal fans 418 and a heat exchanger 420.

The cabinet 412 includes the brackets for supporting electronic assemblies in a vertical array 415 between a first vertical airflow path 424 and a second vertical air flow path 426 of the cabinet, and an air flow distribution device 450 positioned in the second vertical air flow path 426 adjacent the vertical array 415 for establishing a predetermined flow rate distribution through the vertical array 415. The air flow distribution device 450 is similar to the air flow distribution device 50 of FIG. 5.

The cabinet 412 is enclosed about the vertical array 415 and the vertical airflow paths 424, 426 and includes a closed base 436. The heat exchanger 420 is positioned between the base 436 and the vertical array 415, and the cabinet 412 defines an air flow path 446 connecting the first vertical airflow path 424 and the second vertical air flow path 426 of the cabinet 412 and directing air flow through the heat exchanger 420.

The cabinet 412 also includes a rear door 430 having a plenum 431 containing the centrifugal fans 418 of the system 400 in a vertical array. The plenum 431 connects the second vertical air flow path 426 to the heat exchanger air flow path 446. By mounting the fans 418 in this manner, more space is provided for the fans 418, which in turn provide a greater overall rate of air flow, and thus a greater heat removal capacity.

Figure 19:
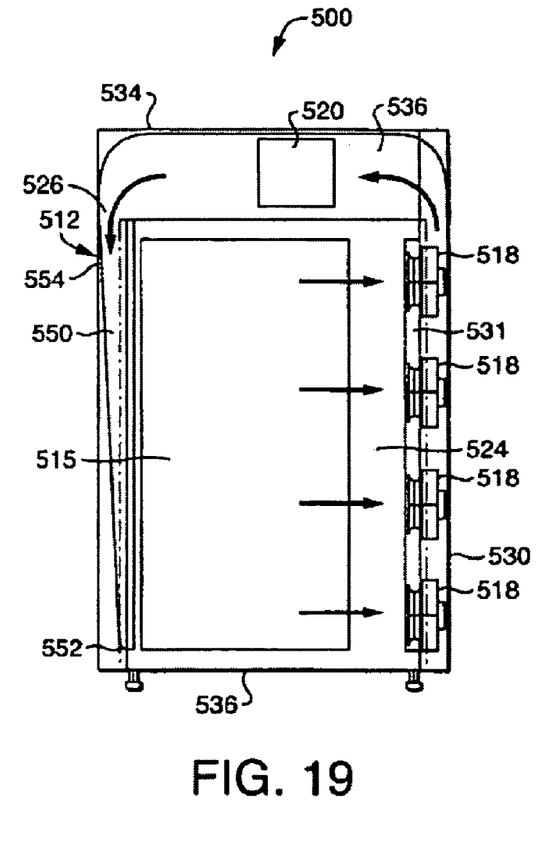
FIG. 19 is a side sectional view of yet another new and improved system for removing heat from a plurality of electronic assemblies, such as data servers, constructed in accordance with the present invention.
Figure 20:
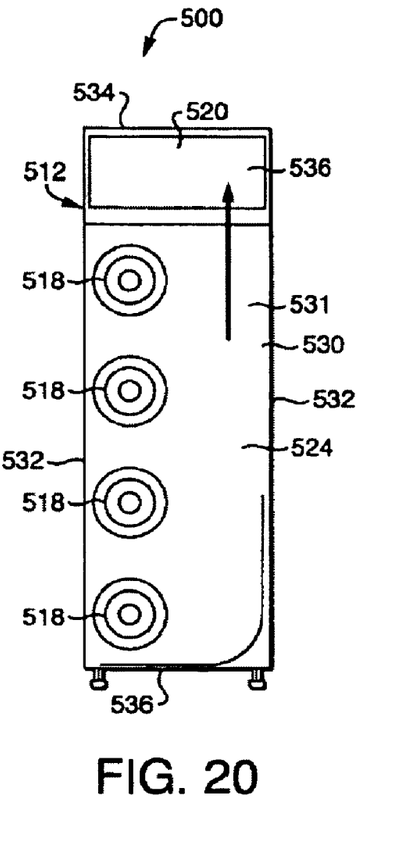
FIG. 20 is a rear sectional view of the system of FIG. 19.

FIGS. 19 and 20 show another new and improved system 500 for removing heat from a plurality of electronic assemblies, such as data servers, constructed in accordance with the present invention. The system 500 of FIGS. 19 and 20 is similar to the system 400 of FIGS. 16 through 18 such that the same elements have the same reference numeral preceded by a "5". The system 500 of FIGS. 19 and 20, however, includes a cabinet 512 that houses a heat exchanger 520 between a top panel 534 and a vertical array 515, and defines an air flow path 546 connecting the first vertical airflow path 524 and a plenum 531 of a rear door 530 and directing air flow through the heat exchanger 520. Centrifugal fans 518 are positioned in the plenum 531 of the rear door 530.

In addition, the cabinet 512 has an air flow distribution device 550 positioned in the second vertical air flow path 526 adjacent the vertical array 515 for establishing a predetermined flow rate distribution through the vertical array 515. The air flow distribution device 550 is similar to the air flow distribution device 50 of FIG. 5, but is inverted. In other words, the air flow distribution device 550 extends vertically and laterally within the second airflow path 526 between a lower end 552 nearer a closed base 536 of the cabinet 512 and an upper end 554 further from the closed base 536, such that the upper end 554 of the distribution device is further from the vertical array 515 than the lower end 552. In this manner, the device 550 reduces the cross-sectional area of the second air flow path 526 further from the heat exchanger 520, to apportion airflow from the second airflow path 526 of the cabinet 512 approximately equally amongst electronic devices supported in the vertical array 515.

Although the present inventions have been described and illustrated in detail, it is to be clearly understood that the same is by way of illustration and example only and is not to be taken by way of limitation. Embodiments of the present inventions can be provided with many changes without departing from the scope of the present inventions. For example the centrifugal fans 518 of the system 500 of FIG. 19 can be replaced with axial fans located near the heat exchanger 520 between the top panel 534 and the vertical array 515. In addition, in all embodiments where axial fans are employed adjacent to the heat exchangers, the axial fans can be located on the "exit" side of the heat exchanger in the cool air stream, instead of in the hot air stream at the "entry" side of the heat exchanger (this can have a beneficial effect on the life of the fans). Accordingly, the scope of the present invention is limited only by the terms of the appended claims.

What is claimed is:

1. A cabinet for supporting electronic assemblies, comprising:
   A. a base,
   B. a top panel vertically spaced from said base,
   C. a front panel, a back panel and two side panels extending between said top panel and said base, and defining an interior region for containing said electronic assemblies,
   D. a bracket assembly adapted to support said electronic assemblies in a vertical array in said interior region,
   E. a first vertical flow path disposed between said front panel and said interior region,
   F. a second vertical flow path disposed between said back panel and said interior region,
   wherein said first vertical flow path and said second vertical flow path are in fluid communication by way of a plurality of transverse flow paths extending through said interior region from said first vertical flow path to said second vertical flow path,
   G. a plurality of fans in an array supported by a panel disposed between said interior region and said second vertical flow path, each of said fans having an inlet in fluid communication with said transverse flow paths and an outlet in fluid communication with said second vertical flow path,
   H. a cap flow path extending from said second vertical flow path to said first vertical flow path, thereby forming a plurality of closed flow paths, each closed flow path including at least a portion of said first vertical flow path, one of said transverse flow paths, at least a portion of said second vertical flow path, and said cap flow path, and
   I. a heat exchanger disposed along said cap flow path.

2. A cabinet according to claim 1 wherein said array of fans is a vertical array.

3. A cabinet according to claim 1 wherein said array of fans is a horizontal array.

4. A cabinet according to claim 1 wherein said first vertical flow path extends in a direction toward said top panel, said second vertical flow path extends in a direction toward said base, and said cap flow path is adjacent to said base.

5. A cabinet according to claim 4 wherein said array of fans is a vertical array.

6. A cabinet according to claim 4 wherein said array of fans is a horizontal array.

7. A cabinet according to claim 1 wherein said first vertical flow path extends in a direction toward said base, said second vertical flow path extends in a direction toward said top panel, and said cap flow path is near said top panel.

8. A cabinet according to claim 7 wherein said array of fans is a vertical array.

9. A cabinet according to claim 7 wherein said array of fans is a horizontal array.

* * * * *